US010439379B2

(12) United States Patent
Tahara et al.

(10) Patent No.: US 10,439,379 B2
(45) Date of Patent: Oct. 8, 2019

(54) SUBSTRATE UNIT

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Hideaki Tahara, Mie (JP); Arinobu Nakamura, Mie (JP); Kazuyoshi Ohara, Mie (JP); Munsoku O, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/062,997

(22) PCT Filed: Jun. 7, 2017

(86) PCT No.: PCT/JP2017/021200
§ 371 (c)(1),
(2) Date: Jun. 15, 2018

(87) PCT Pub. No.: WO2017/213194
PCT Pub. Date: Dec. 14, 2017

(65) Prior Publication Data
US 2019/0123539 A1  Apr. 25, 2019

(30) Foreign Application Priority Data
Jun. 8, 2016  (JP) ................................ 2016-114858

(51) Int. Cl.
*H02G 3/16* (2006.01)
*H05K 7/06* (2006.01)
(Continued)

(52) U.S. Cl.
CPC .......... *H02G 3/16* (2013.01); *B60R 16/0239* (2013.01); *H01R 25/16* (2013.01); *H05K 1/00* (2013.01);
(Continued)

(58) Field of Classification Search
CPC  H02G 3/16; H02G 3/086; H02G 3/08; H02G 3/081; H02G 5/00; H02G 5/06;
(Continued)

(56) References Cited

U.S. PATENT DOCUMENTS 6,325,640 B1 * 12/2001 Kasai .................. H01R 25/168
174/71 B
6,548,972 B2 * 4/2003 Takagi ................. H05K 5/0213
361/688
(Continued)

FOREIGN PATENT DOCUMENTS

JP  2004-363035 A  12/2004
JP  2005-117719 A  4/2005

OTHER PUBLICATIONS

Search Report for PCT/JP2017/021200, dated Sep. 12, 2017.

*Primary Examiner* — Angel R Estrada
(74) *Attorney, Agent, or Firm* — Honigman LLP

(57) ABSTRACT

A substrate unit includes a circuit board, a connector portion installed at the front end portion of the upper side of the circuit board, a busbar connected to the circuit board and fixed to the lower side of the circuit board, a bottom portion including a recessed portion overlapping the front end portion of the circuit board and arranged on the lower side of the busbar, and a bonding layer fixing the busbar to the
(Continued)

bottom portion. The busbar includes a non-bonding region that faces the recessed portion. A bonding region includes the bonding layer surrounding three sides other than a front side, namely a left side, a right side, and a rear side, of the non-bonding region. Notches are located on a left side and a right side of the front end portion and overlap extension lines of boundary between the non-bonding and the bonding region.

3 Claims, 6 Drawing Sheets

(51) Int. Cl.
*H01R 25/16* (2006.01)
*H05K 5/02* (2006.01)
*B60R 16/023* (2006.01)
*H05K 1/00* (2006.01)
*H05K 5/00* (2006.01)
*H01R 12/71* (2011.01)
*H01R 12/70* (2011.01)
*H01R 12/72* (2011.01)
*H02G 3/08* (2006.01)

(52) U.S. Cl.
CPC ............ H05K 5/0043 (2013.01); H05K 5/02 (2013.01); H05K 7/06 (2013.01); *H01R 12/7047* (2013.01); *H01R 12/71* (2013.01); *H01R 12/724* (2013.01); *H02G 3/086* (2013.01)

(58) Field of Classification Search
CPC ...... H02G 7/06; H01R 25/16; H01R 12/7047; H01R 12/71; H01R 12/724; H01R 13/46; H01R 13/50; H05K 1/00; H05K 5/0043; H05K 5/02; H05K 7/06; H05K 1/02; H05K 5/0004; H05K 5/0217; H05K 5/0247; B60R 16/02; B60R 16/00; B60R 16/0239
USPC ...... 174/59, 50, 520, 535, 72 B, 88 B, 70 B, 174/99 B, 262; 361/600, 601, 611, 361/679.01, 755, 749, 752, 796, 760, 775, 361/772, 778; 439/76.1, 76.2
See application file for complete search history.

(56) References Cited

U.S. PATENT DOCUMENTS

| | | | |
|---|---|---|---|
| 7,074,053 B2 * | 7/2006 | Kawakita | H01R 13/6658 174/520 |
| 7,914,297 B2 * | 3/2011 | Ikeda | H01R 9/2466 439/76.1 |
| 8,929,093 B2 * | 1/2015 | Yamamoto | H05K 1/144 174/255 |
| 8,953,335 B2 * | 2/2015 | Abe | H01L 23/36 361/722 |
| 2004/0190272 A1 | 9/2004 | Takagi et al. | |

* cited by examiner

SUBSTRATE UNIT

CROSS-REFERENCE TO RELATED APPLICATIONS

This application is the U.S. national stage of PCT/JP2017/021200 filed Jun. 7, 2017, which claims priority of Japanese Patent Application No. 2016-114858 filed on Jun. 8, 2016, which is incorporated herein by reference in its entirety.

FIELD OF THE INVENTION

The present description relates to a substrate unit.

BACKGROUND OF THE INVENTION

A circuit assembly provided in a vehicle-mounted electrical junction box (substrate unit) is disclosed in JP 2003-164039A, for example. This circuit assembly is provided with a connector to be connected to an external wiring material (counterpart connector portion), and the connector is constituted by a terminal that is provided at an end of a busbar component plate bonded to the lower side of a control circuit board, and a housing that is formed in one piece with a case around the busbar component plate and surrounds the terminal. A heat dissipation member (bottom portion) is bonded to the lower sides of the busbar component plate and the case using an adhesive (bonding layer).

SUMMARY OF THE INVENTION

A substrate unit according to this disclosure includes: a circuit board; a connector portion that is installed at a front end portion of an upper side of the circuit board; a busbar that is connected to the circuit board and is fixed to a lower side of the circuit board; a bottom portion that includes a recessed portion formed at a position overlapping the front end portion of the circuit board and that is arranged on a lower side of the busbar; and a bonding layer that fixes the busbar to the bottom portion, wherein the busbar includes: a non-bonding region that faces the recessed portion and is not provided with the bonding layer; a bonding region in which the bonding layer is provided surrounding three sides other than a front side, namely a left side, a right side, and a rear side, of the non-bonding region; and notches that are located on a left side and a right side of the front end portion and that overlap extension lines of boundary between the non-bonding region and the bonding region.

DETAILED DESCRIPTION OF THE PREFERRED EMBODIMENTS

Figure 1:
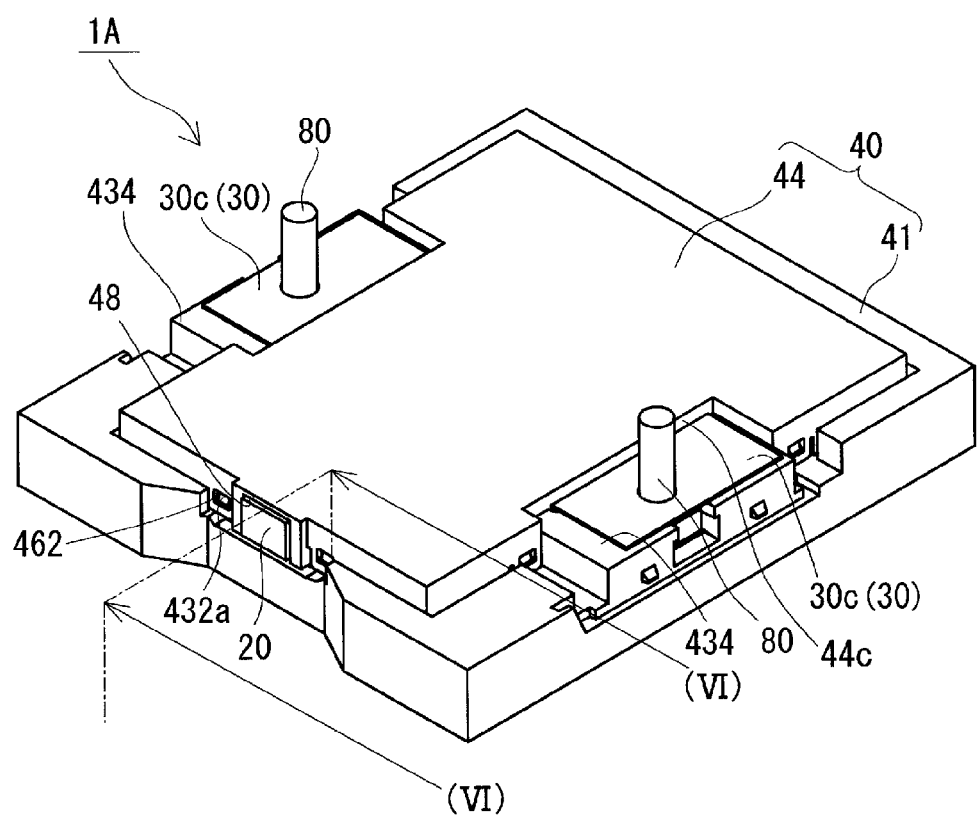
FIG. 1 is a schematic perspective view illustrating a substrate unit according to Embodiment 1.

Depending on the structures and installation positions of installed components such as a connector portion, there are some portions in which the bonding layer is not provided between the bottom portion and portions of the busbar corresponding to the installation positions and between the bottom portion and regions around such portions, and the busbar may be provided with non-bonding regions that are not bonded to the bottom portion. In this case, there is a risk that stress concentration portions are formed near the boundaries between the bonding layer and the non-bonding regions due to the counterpart connector portion being inserted into or removed from the connector portion.

Therefore, an object of the present description is to provide a substrate unit in which stress concentration on the bonding layer due to the counterpart connector portion being inserted into or removed from the connector portion can be suppressed.

With the substrate unit of the present disclosure, stress concentration on the bonding layer due to the counterpart connector portion being inserted into or removed from the connector portion can be suppressed.

First, embodiments of the present description will be listed and described.

(1) A substrate unit according to an aspect of the present description includes: a circuit board; a connector portion that is installed at a front end portion of an upper side of the circuit board; a busbar that is connected to the circuit board and is fixed to a lower side of the circuit board; a bottom portion that includes a recessed portion formed at a position overlapping the front end portion of the circuit board and that is arranged on a lower side of the busbar; and a bonding layer that fixes the busbar to the bottom portion, wherein the busbar includes: a non-bonding region that faces the recessed portion and is not provided with the bonding layer; a bonding region in which the bonding layer is provided surrounding three sides other than a front side, namely a left side, a right side, and a rear side, of the non-bonding region; and notches that are located on a left side and a right side of the front end portion and that overlap extension lines of boundary between the non-bonding region and the bonding region.

With the above-mentioned configuration, stress concentration on the bonding layer due to the counterpart connector portion being inserted into or removed from the connector portion can be suppressed. The reason for this is that since the above-mentioned notches are provided, compared with a case where the notches are not formed, the stress concentration near the boundary between the front end portion of the bonding layer and the non-bonding region is mitigated, thus making it easy to reduce the stress applied to the boundary.

(2) In an embodiment of the above-mentioned substrate unit, the notches have a triangular shape, and one side of the triangular shape is along a front edge of the busbar.

With the above-mentioned configuration, the stress concentration near the boundary between the front end portion of the bonding layer and the non-bonding region is more easily mitigated, thus making it easier to reduce the stress applied to the boundary.

(3) In an embodiment of the above-mentioned substrate unit, the bonding layer contains epoxy resin.

Even when the busbar is fixed to the bottom portion using the bonding layer containing hard resin such as epoxy resin, the stress concentration on the bonding layer due to the counterpart connector portion being inserted into or removed from the connector portion can be suppressed. The reason for this is that since the notches are provided, the stress concentration near the boundary between the front end portion of the bonding layer and the non-bonding region is easily mitigated, thus making it easy to reduce the stress applied to the boundary.

Details of Embodiment of the Present Description

Hereinafter, details of an embodiment of the present invention will be described with reference to the drawings. In the figures, components having the same name are denoted by the same reference numeral.

Embodiment 1

Substrate Unit

A substrate unit 1A according to Embodiment 1 will be described with reference to FIGS. 1 to 6. The substrate unit 1A applies or interrupts an electric current to in-vehicle electrical equipments. The substrate unit 1A includes a circuit board 10, a connector portion 20, a busbar 30 (see FIG. 2), a case 40 including a bottom portion 42 (see FIG. 2), and a bonding layer 50 (see FIG. 2). One feature of the substrate unit 1A is that the busbar 30 is provided with notches 34 formed at predetermined positions. Hereinafter, details of the components will be described. In the following description, in the substrate unit 1A, a side of the circuit board on which the connector portion 20 is installed is referred to as "upper side", and the busbar 30 side is referred to as "lower side". A side on which the connector portion 20 is arranged is referred to as "front side" in a direction orthogonal to the vertical direction, and a side opposite to the front side is referred to as "rear side". A direction orthogonal to the vertical direction and the front-rear direction is referred to as "left-right direction".

Circuit Board

Figure 2:
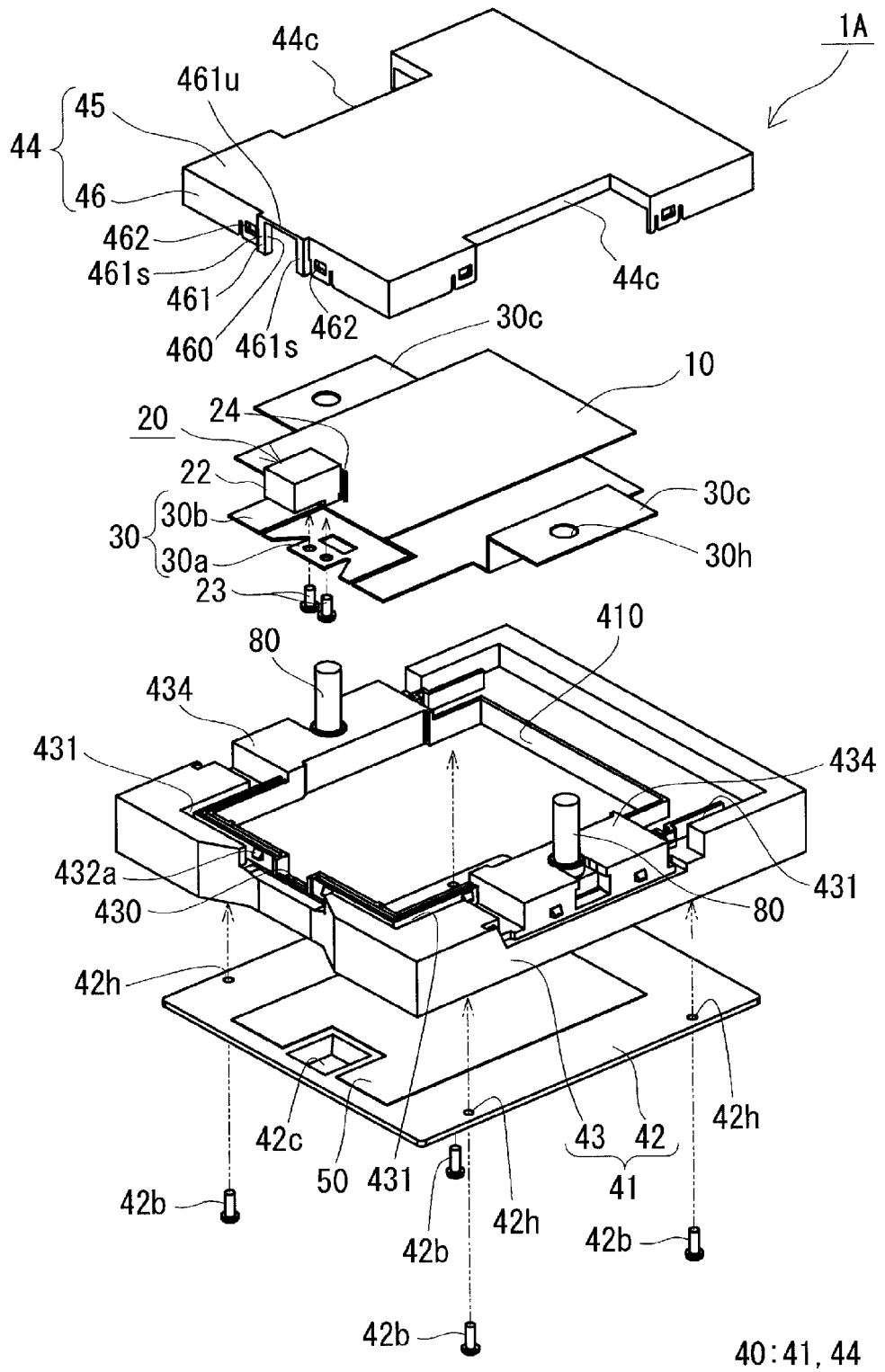
FIG. 2 is a schematic exploded perspective view illustrating the substrate unit according to Embodiment 1.

Electronic components (not shown) such as a semiconductor relay, and the connector portion 20 are installed on the circuit board 10 (see FIG. 2). The circuit board 10 includes an insulating board, and a circuit (conductive) pattern (not shown) that is formed on one side of the insulating board and to which the electronic components are electrically connected. A printed circuit board can be used as this circuit board 10.

Connector Portion

The connector portion 20 connects a counterpart connector portion (not shown) to the substrate unit 1A. The counterpart connector portion is connected to the in-vehicle electrical equipment or the like via a wire harness. The connector portion 20 is arranged in an opening 48 formed in a lateral wall of the case 40, which will be describe later, and is then sandwiched between a lower case 41 and an upper cover 44 of the case 40, and is thus positioned with respect to the case 40 (see FIG. 1). The connector portion 20 is installed on the upper side of the circuit board 10 in the case 40 (see FIG. 2). The connector portion 20 includes a connector housing 22, fixation members 23, and a connector terminal 24.

Connector Housing

Figure 3:
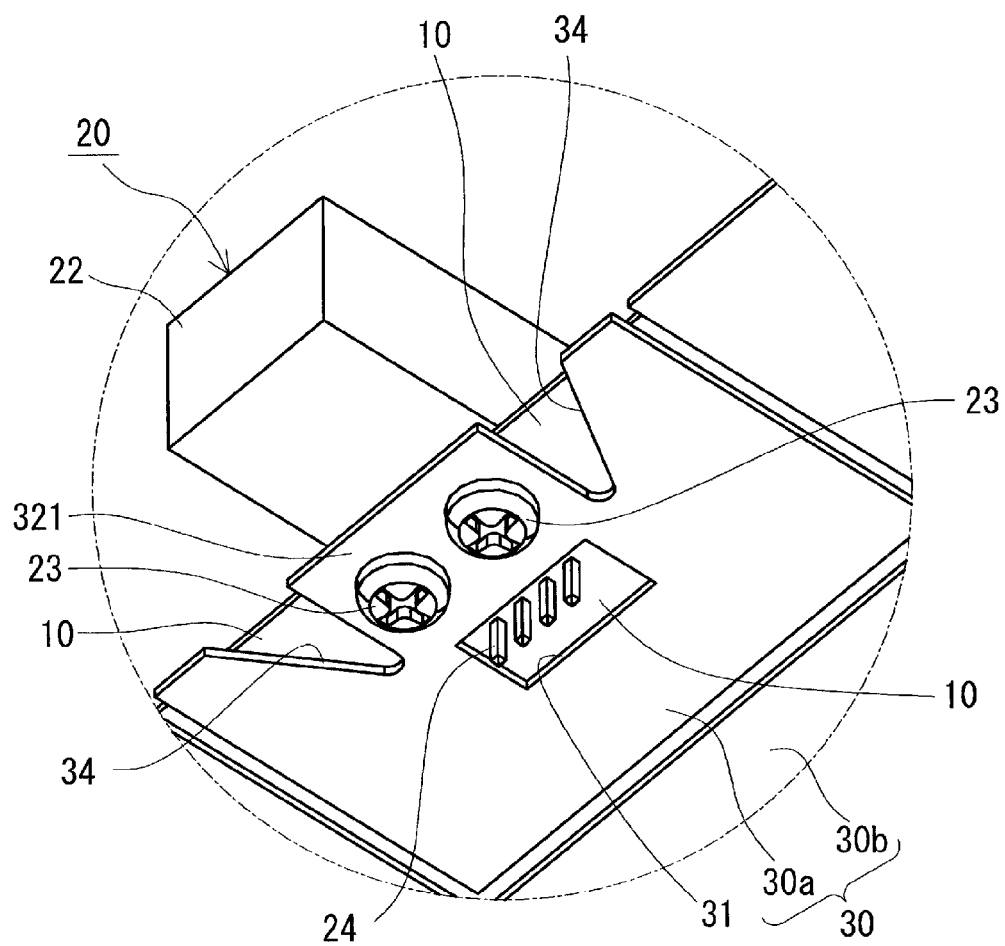
FIG. 3 is a schematic perspective view illustrating the lower side of a busbar provided in the substrate unit according to Embodiment 1.

The counterpart connector portion is fitted to the connector housing 22 (see FIGS. 1 to 3). The connector housing 22 has a hood-like shape. FIGS. 1 to 3 show a pillar-shaped connector housing 22 for illustrative reasons. A side (rear side) opposite to the opening (front side) in the connector housing 22 is fixed to the front end portion of the busbar 30 (connector arrangement portion 30a), which will be described later, and the opening (not shown) of the connector housing 22 is located outward with respect to the front edge of the circuit board 10 (see FIGS. 3 and 4). This front end portion is configured such that a region on which the connector portion 20 is placed has a length required for the fixation of the connector housing 22 in the front-rear direction. The lower surface on the rear side of the connector housing 22 is provided with an attachment portion (not shown) to which the fixation members 23 for fixing the connector housing 22 to the above-mentioned front end portion are attached.

Fixation Member

The fixation members 23 fix the connector housing 22 to the circuit board 10 and a fixation piece 321 of the front end portion of the busbar 30 (connector arrangement portion 30a), which will be described later (see FIGS. 3 and 4). For example, screws can be used as the fixation members 23. In this specification, two fixation members 23 are provided in parallel in the left-right direction on the lower side at the rear end of the connector housing 22. The fixation members 23 are inserted into through holes 322 (see FIG. 5) of the busbar 30 (connector arrangement portion 30a) and insertion holes (not shown) of the circuit board 10 from the lower side, and are then attached to the attachment portion of the connector housing 22. The connector housing 22 is thus fixed to the circuit board 10 and the front end portion of the busbar 30. The heads of the fixation member 23, that is, the heads of the screws in this embodiment, protrude downward from the lower side of the busbar 30.

Connector Terminal

The connector terminal 24 electrically connects the counterpart connector portion and the circuit board 10 (see FIGS. 2 to 4, and FIG. 6). The connector terminal 24 is provided passing through an inner wall on a side opposite to the opening of the connector housing 22. The connector terminal 24 is guided from the inside of the connector housing 22 to the rear side with respect to the connector housing 22, and extends toward the circuit board 10 side (lower side) (see FIG. 6). One end of the connector terminal 24 is arranged inside the connector housing 22 and is electrically connected to the counterpart connector portion inside the connector housing 22. The other end of the connector terminal 24 passes through the circuit board 10 and is electrically connected to the circuit pattern. Specifically, the other end of the connector terminal 24 protrudes downward from the lower side of the circuit board 10. The connector terminal 24 can be electrically connected to the circuit pattern using a known method such as soldering.

Busbar

The busbar 30 is a part of a power circuit (see FIG. 2). The busbar 30 is connected to a power source or an electrical load. Examples of the material of the busbar 30 include conductive metals, and specific examples thereof include copper and a copper alloy. In this specification, the busbar 30 includes a central portion that is slightly larger than the circuit board 10, and extension portions 30c that have a step shape and extend from the left and right portions of the central portion.

The above-mentioned central portion is provided between the circuit board 10 and the bottom portion 42 and is connected to the circuit on the circuit board 10. A bonding layer (not shown) provided between the circuit board 10 and the above-mentioned central portion can be used to fix the circuit board 10 to the central portion, and the bonding layer 50 (which will be described later) provided between the above-mentioned central portion and the bottom portion 42 can be used to fix the central portion to the bottom portion 42. The above-mentioned central portion includes a plurality of copper plate pieces, and the copper plate pieces are arranged in a predetermined layout. The above-mentioned central portion includes a connector arrangement portion 30a and a rear portion 30b.

The extension portions 30c are portions to which external devices are electrically connected, and connection terminals of electric wires (wire harnesses) (not shown) are electrically connected to the extension portions 30c. The extension portions 30c are arranged on the upper surfaces of base portions 434 of the lower case 41, which will be described later. In this specification, the extension portions 30c and the rear portion 30b are formed in one piece. The extension portions 30c are each provided with a terminal insertion hole 30h into which a male screw 80 fixed to a terminal fixation portion of the base portion 434 is inserted. A wire harness (not shown) is attached to the male screw 80. The busbar 30 and the wire harness are electrically connected to each other via the male screw 80.

Connector Arrangement Portion

Figure 4:
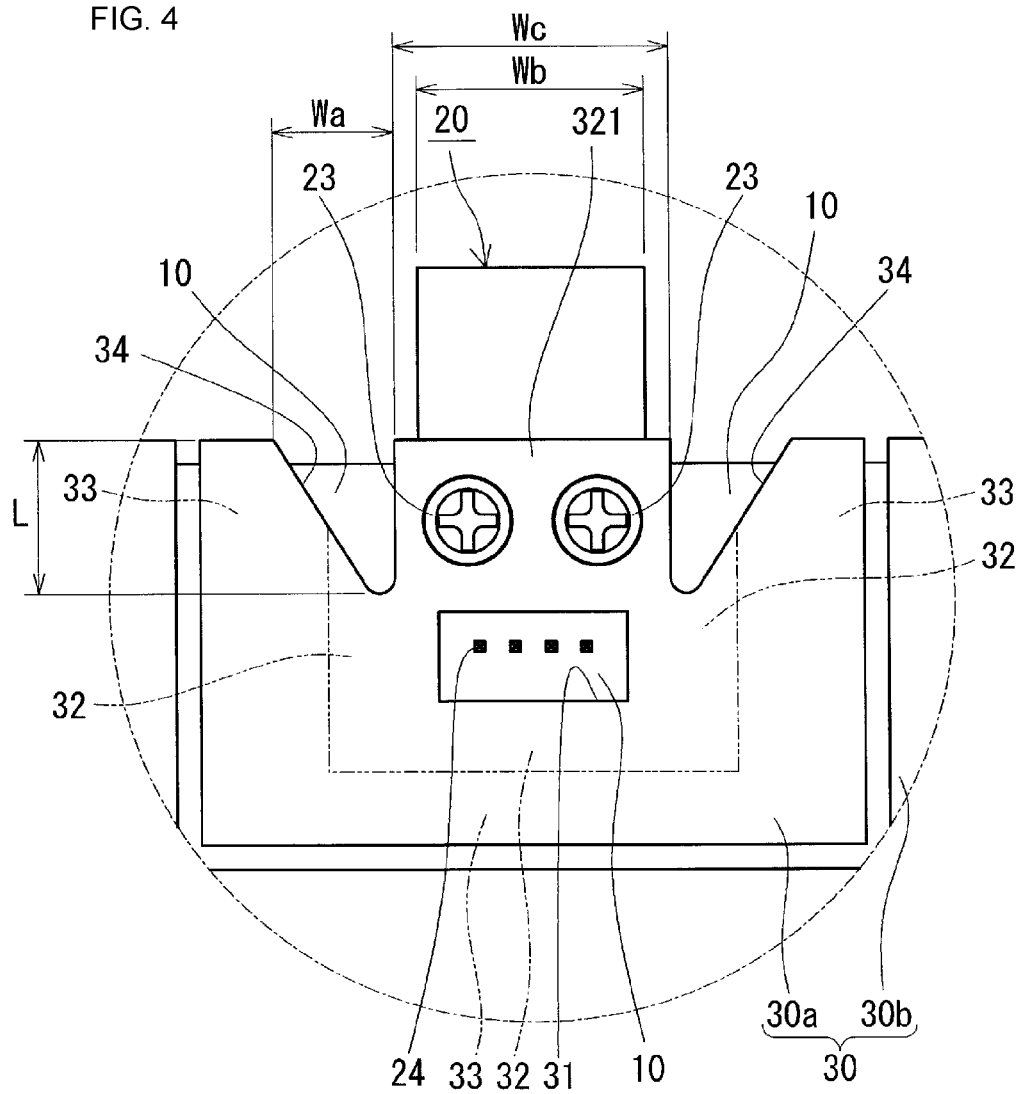
FIG. 4 is a schematic bottom view illustrating the lower side at the front end of the busbar provided in the substrate unit according to Embodiment 1.

The connector portion 20 is installed on the connector arrangement portion 30a (see FIGS. 3 and 4). The connector arrangement portion 30a is a front central portion including the front end portion of the above-mentioned central portion (busbar 30), and is located below the connector portion 20. The connector arrangement portion 30a has a rectangular frame shape. The connector arrangement portion 30a is provided with a terminal insertion hole 31, a non-bonding region 32, a bonding region 33, and notches 34.

Terminal Insertion Hole

Figure 6:
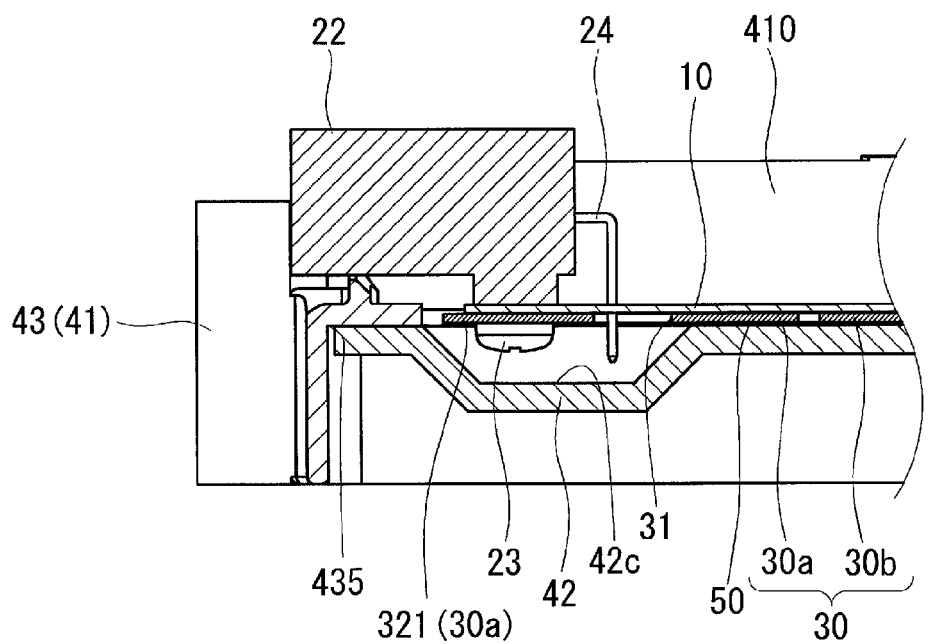
FIG. 6 is a cross-sectional view of the substrate unit taken along line (VI)-(VI) in FIG. 1.

The connector terminal 24 is inserted into the terminal insertion hole 31 (see FIGS. 3, 4, and 6). The terminal insertion hole 31 is located on the rear side with respect to the fixation piece 321, which will be described later, and above a recessed portion 42c of the bottom portion 42.

Non-Bonding Region

The non-bonding region 32 is a region in which the bonding layer 50 is not provided (the inside of the long-double-short-dashed line in FIG. 4). Therefore, the non-bonding region 32 is not bonded to the bottom portion 42. The non-bonding region 32 includes a recessed portion facing region that faces the recessed portion 42c (see FIG. 5). In this specification, the non-bonding region 32 is constituted by the recessed portion facing region and a region around the recessed portion facing region. The recessed portion facing region is a region surrounding the terminal insertion hole 31 including the fixation piece 321 (which will be described later) provided at the front end portion of the connector arrangement portion 30a. The region around the recessed portion facing region is a region that does not face the recessed portion 42c but faces a region around the outer periphery of the recessed portion 42c in the bottom portion 42, and has a margin such that the bonding layer 50 does not overlap the recessed portion 42c.

Fixation Piece

The fixation piece 321 is a part of the connector arrangement portion 30a, and the fixation members 23 are fixed to the fixation piece 321 (see FIGS. 3 to 6). The fixation piece 321 is formed at the front end portion of the connector arrangement portion 30a (busbar 30), and is a part of the above-mentioned recessed portion facing region. Accordingly, the fixation piece 321 is not bonded (fixed) to the bottom portion 42. In this specification, the front edge of the fixation piece 321 (the front edge of the connector arrangement portion 30a) faces the recessed portion. The fixation piece 321 is provided with the through holes 322 into which the fixation members 23 are inserted.

A width Wc of the fixation piece 321 can be set to be larger than or equal to a width Wb of the connector housing 22. The length of the front edge of the connector arrangement portion 30a in the left-right direction is taken as the width Wc of the fixation piece 321, and the length of the connector housing 22 in the left-right direction is taken as the width Wb of the connector housing 22. Depending on the size (width Wa) of the notches 34, which will be described later, the width Wc of the fixation piece 321 is set to be about 1.2 times as large as the width Wb of the connector housing 22.

Bonding Region

The bonding region 33 is a region in which the bonding layer 50 is provided (the outside of the long-double-short-dashed line in FIG. 4). Therefore, the bonding region 33 is bonded to the bottom portion 42. The bonding region 33 is constituted by a region that surrounds the three sides other than the front edge, namely the left, right, and rear sides, of the non-bonding region 32. Specifically, the bonding region 33 is constituted by the left, right, and rear end portions of the connector arrangement portion 30a.

Notch

With the notches 34, the stress concentration near the boundaries between the left and right front end portions of the bonding layer 50, which will be described later, and the non-bonding region 32 is mitigated, and the stress applied to the boundaries is thus reduced (see FIGS. 3 to 5). Accordingly, even if the counterpart connector portion is inserted into or removed from the connector portion 20 so that force is applied to the connector portion 20 in the vertical direction, the stress concentration on the bonding layer 50 can be suppressed. The notches 34 are formed at positions that are located on the left and right sides of the front end portion of the connector arrangement portion 30a and that overlap the extension lines of the boundary between the non-bonding region 32 and the bonding region 33. The portions of the boundaries on the left and right sides of the front end portion extend in the axis direction of the connector portion 20 (direction in which the counterpart connector portion is inserted or removed).

Examples of the shape of the notches 34 in a top view include a shape in which the width (length in the left-right direction) decreases from the front edge of the connector arrangement portion 30a toward the rear side, and a shape in which the width is made constant from the front edge of the connector arrangement portion 30a toward the rear side. Examples of the shape in which the width decreases include (1) a triangular shape in which one end is along the front edge (end surface) of the connector arrangement portion 30a, (2) a trapezoidal shape in which one side other than an oblique side is along the above-mentioned front edge, and (3) an arc shape in which a chord is along the above-mentioned front edge and an arc is located on the rear side. On the other hand, an example of the shape having a constant width is a quadrangular shape in which one side is along the above-mentioned front edge. Examples of the triangular shape include a right-angled triangle, an isosceles triangle, and an equilateral triangle. Examples of the trapezoidal shape include a right trapezoid and an isosceles trapezoid. An example of the arc shape is a semicircle. Examples of the quadrangular shape include a square and a rectangle. In all cases, the corners may be rounded or cut as appropriate.

When the notches 34 have a triangular shape in a top view, it is preferable that one side is along the front edge of the connector arrangement portion 30a and one of the remaining two sides intersects the boundary between the non-bonding region 32 and the bonding region 33 at a non-right angle. When the notches 34 have a trapezoidal shape in a top view, it is preferable that a long side is along the above-mentioned front edge, a short side is located on the rear side, and an oblique side intersects the above-mentioned boundary at a non-right angle. In the case of the trapezoidal shape, particularly a right trapezoid, in addition to the description above, the notches 34 may be formed such that a side intersecting both adjacent sides at a right angle is along the above-mentioned front edge and an oblique side intersects the above-mentioned boundary at a non-right angle. When the notches 34 have an arc shape in a top view, it is preferable that a chord is along the above-mentioned front edge and the tangent of an arc intersects the above-mentioned boundary at a non-right angle. "Intersecting at a non-right angle" means that the above-mentioned one side, oblique side, or tangent of an arc extends in non-parallel with the above-mentioned boundary and does not intersect the boundary at a right angle, and two angles formed between the above-mentioned one side, oblique side, or tangent of an arc and each of the above-mentioned boundary are different from each other. This makes it easy to reduce the stress concentration near the boundary between the front edge of the bonding layer 50 and the non-bonding region 32. It is particularly preferable that the side (tangent) intersecting the boundary is arranged on the exterior side in the left-right direction.

When the maximum length in the front-rear direction (axis direction of the connector portion 20) is taken as a length L of the notch 34, the length L can be set to be larger than or equal to a length between the front edge of the connector arrangement portion 30a and the centers of the fixation members 23, for example. This makes it easy to mitigate the stress concentration near the boundaries between the left and right front end portions of the bonding layer 50 and the non-bonding region 32 and reduce the stress applied to the boundaries. The length L of the notch 34 can be set to be smaller than or equal to a length between the front edge of the connector arrangement portion 30a and the rear edge of the terminal insertion hole 31. This prevents the length L of the notch 34 from being excessively large. Therefore, deterioration of the strength of the fixation piece 321 can be easily suppressed. The length L of the notch 34 can be set to be larger than or equal to the length between the front edge of the connector arrangement portion 30a and the front edge of the terminal insertion hole 31, and smaller than or equal to the length between the front edge of the connector arrangement portion 30a and the center of the terminal insertion hole 31 in the front-rear direction.

When the maximum length in the left-right direction is taken as a width Wa of the notch 34, the width Wa can be set to be smaller than or equal to the width We of the fixation piece 321, for example. The width Wa can be set to satisfy the condition that Wa≤(⅔)Wc. This prevents the width Wa of the notch 34 from being excessively large. In many cases, the length of the notch 34 at the front edge of the connector arrangement portion 30a is taken as the width Wa of the notch 34.

In this specification, the notches 34 have a right-angled triangle in a top view in which one of two sides that intersect at a right angle is along the above-mentioned front edge of the connector arrangement portion 30a, the other of the two sides forms a lateral side of the fixation piece 321 in the left-right direction, and an oblique side intersects the boundary. The above-mentioned one side intersects the axis direction of the connector portion 20 at a right angle, and the above-mentioned other side (lateral side) extends in the axis direction of the connector portion 20. The length L of the notch 34 is set to be a length spanning from the front edge of the connector arrangement portion 30a to a position located between the front edge of the terminal insertion hole 31 and the center of the terminal insertion hole 31 in the front-rear direction. The width Wa of the notch 34 is set to be about ⅔ times as large as the width We of the fixation piece 321.

Rear Portion

The rear portion 30b is a region of the above-mentioned central portion other than the connector arrangement portion 30a (see FIG. 2). A rectangular notch to which the connector arrangement portion 30a is fitted is formed at the center of the front side of the rear portion 30b. The rear portion 30b surrounds the three sides other than the front side of the connector arrangement portion 30a, and is arranged with a predetermined interval with respect to the connector arrangement portion 30a.

Case

The circuit board 10 (see FIG. 2), the connector portion 20, and the busbar 30 (see FIG. 2) are accommodated in the case 40 (see FIG. 1). As shown in FIG. 1, the lower case 41 and the upper cover 44 are assembled into the case 40. The lateral wall of the case 40 formed by assembling the lower case 41 and the upper cover 44 is provided with the opening 48 that is formed through the assembly of the lower case 41 and the upper cover 44 and through which the connector portion 20 and the counterpart connector portion can be fitted to each other.

Lower Case

The circuit board 10, the connector portion 20, and the busbar 30 (which will be described later) are accommodated in the lower case 41 (see FIG. 2). The lower case 41 includes the bottom portion 42 and a lateral wall portion 43 that has a small height and is provided upright from the peripheral edge of the bottom portion 42. The lower case 41 has a box shape in which a side (upper side) opposite to the bottom portion 42 is open. A portion surrounded by the bottom portion 42 and the lateral wall portion 43 serves as an accommodation portion 410 in which the circuit board 10, the connector portion 20, and the busbar 30 are accommodated. In this embodiment, the bottom portion 42 and the lateral wall portion 43 are molded separately, that is, they are separate members, and are integrated using fixation members such as screws 42b.

Bottom Portion

Figure 5:
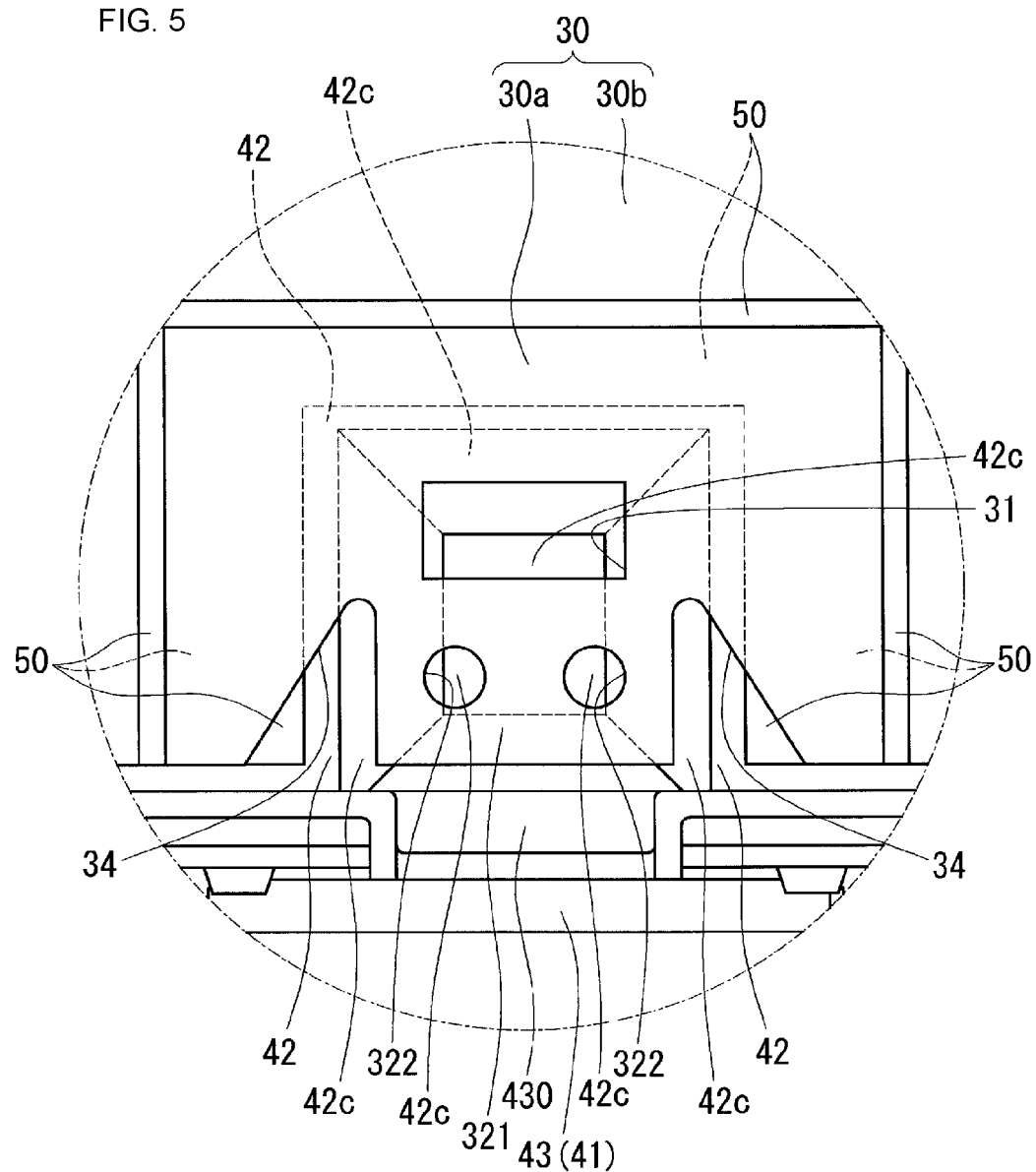
FIG. 5 is a schematic top view illustrating the upper side at the front end of the busbar provided in the substrate unit according to Embodiment 1.

The circuit board 10 and the busbar 30 are mounted on the bottom portion 42 (see FIGS. 2, 5, and 6). The bottom portion 42 has a flat shape and is larger than the circuit board 10 and the busbar 30. The bottom portion 42 is constituted by a heat sink for dissipating heat generated by electronic components installed on the circuit board 10. A plate of metal such as aluminum can be used as the heat sink, for example. The bottom portion 42 is provided with the recessed portion 42c and insertion holes 42h.

Recessed Portion

The recessed portion 42c is formed at a position overlapping the front end portions of the circuit board 10 and the connector arrangement portion 30a (busbar 30) (see FIGS. 2, 5, and 6). "Overlapping the front end portions" encompasses a case where the front end portions entirely overlap the recessed portion 42c as well as a case where the front end portions partially overlap the recessed portion 42c. For example, the front end portions may partially overlap the recessed portion 42c as in a case where the front edges of the circuit board 10 and the connector arrangement portion 30a reach a flat portion provided with no opening over the recessed portion 42c from the rear side. The recessed portion 42c is formed at such a position that it overlaps the terminal insertion hole 31 of the connector arrangement portion 30a and a region around the terminal insertion hole 31 that includes the fixation piece 321. The fixation members 23 and the other end of the connector terminal 24 are accommodated in the recessed portion 42c (see FIG. 6). As described above, the fixation members 23 and the other end of the connector terminal 24 protrude downward from the lower side of the busbar 30. Therefore, the recessed portion 42c can prevent the fixation members 23 and the other end of the connector terminal 24 from interfering with the bottom portion 42.

Insertion Hole

The screws 42b for integrating the bottom portion 42 and the lateral wall portion 43 are inserted through the insertion holes 42h (see FIG. 2). In this specification, the insertion holes 42h are formed in the front and rear portions on the left and right sides of the bottom portion 42.

Lateral Wall Portion

The lateral wall portion 43 and the bottom portion 42 form the accommodation portion 410 in which the circuit board 10 and the busbar 30 are accommodated. The lateral wall portion 43 has a substantially rectangular frame shape that is continuous along the entire periphery of the bottom portion 42. The lateral wall portion 43 surrounds the four sides of the outer periphery of the circuit board 10 including the connector portion 20. The lateral wall portion 43 includes a lower recessed portion 430 formed on the upper side of the lateral wall portion 43, an insertion groove 431, engagement projections 432a, base portions 434, and a step portion 435 formed on the lower side of the lateral wall portion 43.

Lower Recessed Portion

The lower recessed portion 430 and an upper recessed portion 460 of the upper cover 44 form the opening 48 (see FIG. 1) inside which the connector portion 20 is arranged. The lower recessed portion 430 is formed at a position corresponding to the upper recessed portion 460, that is, at the center of the front portion of the lateral wall portion 43. The size of the lower recessed portion 430 can be selected as appropriate as long as the connector portion 20 can be arranged inside the opening 48 formed by the lower recessed portion 430 and the upper recessed portion 460 and can be positioned with respect to the case 40.

Insertion Groove

A lateral wall portion 46 of the upper cover 44 is inserted into the insertion groove 431 (see FIG. 2). A position at which the insertion groove 431 (the shape in a top view) is formed can be selected as appropriate in accordance with the position at which the lateral wall portion 46 of the upper cover 44 is formed (the shape in a bottom view). The insertion groove 431 is formed at a position on the upper side of the lateral wall portion 43 excluding the central portions on the left and right sides. The insertion groove 431 is formed at a position including the left and right corners on the front side of the lateral wall portion 43 and regions of the left and right sides on the rear side. The insertion groove 431 has an L shape in a plan view on the front side, and has an I shape in a plan view on the rear side. The width and depth of the insertion groove 431 can be selected as appropriate in accordance with the thickness and the insertion amount of the lateral wall portion 46 of the upper cover 44.

Engagement Projection

The engagement projections 432a are engaged with engagement holes 462 of the lateral wall portion 46 of the upper cover 44 inserted into the insertion groove 431. The upper cover 44 is fixed to the lower case 41 through this engagement. The engagement projections 432a are provided at appropriate positions that are lined up in the peripheral direction of the lateral wall portion 43 and correspond to the engagement holes 462. The engagement projections 432a are provided on the lateral surface that forms the front portion of the insertion groove 431 and the lateral surfaces that form the left and right portions of the insertion groove 431.

Base Portion

The base portions 434 each have a terminal fixation portion to which the male screw 80 is fixed. The base portions 434 are formed on the upper sides of the central portions on the left and right sides. The extension portions 30c of the busbar 30 are mounted on the base portions 434.

Step Portion

The bottom portion 42 is fitted to the step portion 435 (see FIG. 6). The step portion 435 is formed at the inner peripheral edge of the lower side of the lateral wall portion 43. The step portion 435 is provided with screw holes (not shown) to which the screws 42b for integrating the bottom portion 42 and the step portion 435 are fixed.

Examples of the material of the lower case 41 include synthetic resins such as polypropylene (PP) resin and polyamide (PA) resin.

Upper Cover

The upper cover 44 covers the accommodation portion 410 of the lower case 41 (see FIG. 2). The upper cover 44 includes a top portion 45 and the lateral wall portion 46. The top portion 45 and the lateral wall portion 46 are formed in one piece. The upper cover 44 has such a shape that the upper cover 44 covers the upper side of the lower case 41 in a state in which the base portions 434 of the lower case 41 are exposed. The upper cover 44 is provided with cutout portions 44c in some portions of the outer wall. With these cutout portions 44c, gaps through which the extension portions 30c of the busbar 30 can pass are ensured even in the state in which the upper cover 44 is fixed to the lower case 41. With these gaps, the extension portions 30c of the busbar 30 can be mounted on the upper sides of the base portions 434.

Top Portion

The top portion 45 forms the upper side of the case 40. The top portion 45 has a substantially rectangular flat shape.

Lateral Wall Portion

The lateral wall portion 46 is engaged with the lower case 41, and the upper cover 44 and the lower case 41 are thus integrated. The lateral wall portion 46 has a small height and is provided vertically downward from the peripheral edge of the top portion 45.

The lateral wall portion 46 is formed at a position at the peripheral edge of the top portion 45 excluding the central portions on the left and right sides. Specifically, some portions of the lateral wall portion 46 are continuous with the front portion of the peripheral edge of the top portion 45 and the front portions of the left and right portions of the peripheral edge of the top portion 45, and some portions of the lateral wall portion 46 are continuous with the rear portion of the peripheral edge of the top portion 45 and the rear portions of the left and right portions of the peripheral edge of the top portion 45. The lateral wall portion 46 are inserted into the insertion groove 431 formed on the upper side of the lower case 41. The lateral wall portion 46 includes the upper recessed portion 460, a protruding portion 461, and engagement holes 462.

Upper Recessed Portion

The upper recessed portion 460 and the lower recessed portion 430 of the lower case 41 form the opening 48 inside which the connector portion 20 is arranged. The upper recessed portion 460 is formed at a position corresponding to the lower recessed portion 430, that is, at the center of the front portion of the lateral wall portion 46. The size of the upper recessed portion 460 can be selected as appropriate as long as the connector portion 20 can be arranged inside the opening 48 formed by the upper recessed portion 460 and the lower recessed portion 430 and can be positioned with respect to the case 40. The connector portion 20 is arranged in the upper recessed portion 460 such that the front end of the connector portion 20 is exposed to the outside.

Protruding Portion

The protruding portion 461 is formed around the upper recessed portion 460 to protrude outward and cover the exposed portion of the connector portion 20. The protruding portion 461 includes an upper portion 461u and two side portions 461s that surround the upper side and two lateral sides of the connector portion 20, and its end surface has a reversed U shape. The lower end portion of the protruding portion 461 (lower end portions of the two side portions 461s) is located below the lower edge of the opening 48 (connector portion 20). The upper portion 461u of the protruding portion 461 is formed to have a flat surface that is substantially flush with the surface (upper side) of the top portion 45.

Engagement Hole

The engagement projections 432a of the lower case 41 are engaged with the engagement holes 462 when the lateral wall portion 46 is inserted into the insertion groove 431 of the lower case 41. With this engagement, the state in which the lateral wall portion 46 is inserted into the insertion groove 431 is maintained, and the upper cover 44 is fixed to the lower case 41. The engagement holes 462 are provided at appropriate positions that are lined up in the peripheral direction of the lateral wall portion 46. In this specification, the engagement holes 462 are provided on the front portion of the lateral wall portion 46 and the left and right portions of the lateral wall portion 46.

Similarly to the lower case 41, examples of the material of the upper cover 44 include synthetic resins such as PP resin and PA resin.

Bonding Layer

The busbar 30 and the bottom portion 42 are fixed to each other with the bonding layer 50. The bonding layer 50 is provided between the busbar 30 and the bottom portion 42. The bonding layer 50 is formed on a region on the bottom portion 42 excluding the recessed portion 42c and a region around the recessed portion 42c. Specifically, the bonding layer 50 is formed on a region including a region surrounding three sides, namely the left, right, and rear sides, of the peripheral edge of the connector arrangement portion 30a, and the entire region on the central portion of the rear portion 30b. Examples of a constituent material of the bonding layer 50 include insulating adhesives such as epoxy resin. Even when the bonding layer 50 is made of hard resin such as epoxy resin, the stress concentration near the boundary between the front edge of the bonding layer 50 and the non-bonding region 32 is easily mitigated due to the notches 34, thus making it easy to reduce the stress applied to the boundary.

Application

The substrate unit 1A can be favorably used in a large-current power control unit such as a DC voltage converter, an AC/AC converter, and a DC/AC inverter.

Functions and Effects

With the substrate unit 1A of Embodiment 1, even if the counterpart connector portion is inserted into or removed from the connector portion 20 so that force is applied to the connector portion 20 in the vertical direction, the stress concentration on the bonding layer 50 can be suppressed. The reason for this is that the notches 34 are provided at positions that are located on the left and right sides of the front end portion of the connector arrangement portion 30a and that overlap the extension lines of the boundary between the non-bonding region 32 and the bonding region 33, and therefore, the stress concentration near the boundary between the front edge of the bonding layer 50 and the non-bonding region 32 is easily mitigated due to the notches 34, thus making it easy to reduce the stress applied to the boundary.

Test Examples

Investigated was whether or not stress applied to the bonding layer due to the counterpart connector portion being inserted into or removed from the connector portion varied depending on whether or not the busbar provided in the substrate unit described in Embodiment 1 was provided with notches. In this specification, the busbars provided in the substrate units of Samples No. 1 and No. 2 for evaluation of stress were not manufactured in practice, but analytic models whose shapes were determined using simulation software were used instead.

Sample No. 1

Notches were provided at positions that were located on the left and right sides of the front end portion of the busbar provided in the substrate unit of Sample No. 1 and that overlapped the extension lines of the boundary between the non-bonding region and the bonding region (see FIGS. 4 and 5 as appropriate). The notches each had an equilateral triangular shape in a top view. One side of the equilateral triangle was along the front edge of the connector arrangement portion, and one of the two remaining sides that was located on the exterior side in the left-right direction intersected the boundary.

Sample No. 2

The busbar provided in the substrate unit of Sample No. 2 was different from that of Sample No. 1 in that notches were not provided at positions that were located on the left and right sides of the front end portion of the busbar and that overlapped the extension lines of the boundary between the non-bonding region and the bonding region. Specifically, the portions of the boundary between the non-bonding region and the bonding region on the left and right sides of the front end portion of the busbar intersected the front edge of the busbar at a right angle.

Evaluation of Stress

Stress applied to the bonding layer was evaluated by performing a numerical analysis using a finite element method to determine stress applied when the connector portion was lifted upward.

In the substrate unit of Sample No. 1 including the busbar provided with the notches, the stress applied near the boundary between the front end portion of the bonding layer and the non-bonding region was small. On the other hand, in the substrate unit of Sample No. 2 including the busbar provided with no notches, the stress applied near the above-mentioned boundary was large. Specifically, when the stress applied near the above-mentioned boundary in the bonding layer in Sample No. 2 was taken as 100, the stress applied near the above-mentioned boundary in the bonding layer in Sample No. 1 was about 50. The stress in Sample No. 1 could be reduced by about 50% compared with that in Sample No. 2. It is found from the results that in the substrate unit including the busbar provided with the notches, the above-mentioned boundary intersected the front edge of the busbar at a non-right angle, and therefore, the stress concentration on the bonding layer could be reduced compared with the substrate unit that included the busbar provided with no notches and in which the above-mentioned boundary intersected the front edge of the busbar at a right angle.

The present description is not limited to this embodiment and is defined by the scope of the appended claims, and all changes that fall within the same essential spirit as the scope of the claims are intended to be included therein.

LIST OF REFERENCE NUMERALS

1A Substrate unit
10 Circuit board
20 Connector portion
22 Connector housing
23 Fixation member
24 Connector terminal
30 Busbar
30a Connector arrangement portion
31 Terminal insertion hole
32 Non-bonding region 321 Fixation piece 322 Through hole
33 Bonding region
34 Notch
30b Rear portion
30c Extension portion
30h Terminal insertion hole
40 Case
41 Lower case 410 Accommodation portion
42 Bottom portion 42c Recessed portion 42h Insertion hole 42b Screw
43 Lateral wall portion
430 Lower recessed portion 431 Insertion groove 432a Engagement projection
434 Base portion 435 Step portion
44 Upper cover 44c Cutout portion
45 Top portion
46 Lateral wall portion
460 Upper recessed portion
461 Protruding portion 461u Upper portion 461s Side portion
462 Engagement hole
48 Opening
50 Bonding layer
80 Male screw

The invention claimed is:

1. A substrate unit comprising:
   a circuit board;
   a connector portion that is installed at a front end portion of an upper side of the circuit board;
   a busbar that is connected to the circuit board and is fixed to a lower side of the circuit board;
   a bottom portion that includes a recessed portion formed at a position overlapping the front end portion of the circuit board and that is arranged on a lower side of the busbar; and
   a bonding layer that fixes the busbar to the bottom portion, wherein the busbar includes:
      a non-bonding region that faces the recessed portion and is not provided with the bonding layer;
      a bonding region in which the bonding layer is provided surrounding three sides other than a front side, namely a left side, a right side, and a rear side, of the non-bonding region; and
      notches that are located on a left side and a right side of the front end portion and that overlap extension lines of boundary between the non-bonding region and the bonding region.

2. The substrate unit according to claim 1, wherein the notches have a triangular shape, and one side of the triangular shape is along a front edge of the busbar.

3. The substrate unit according to claim 1, wherein the bonding layer contains epoxy resin.

* * * * *